US009809901B2

(12) United States Patent
Soeta et al.

(10) Patent No.: US 9,809,901 B2
(45) Date of Patent: Nov. 7, 2017

(54) METHOD FOR MANUFACTURING SILICON SINGLE CRYSTAL

(71) Applicant: SHIN-ETSU HANDOTAI CO., LTD., Tokyo (JP)

(72) Inventors: Satoshi Soeta, Fukui (JP); Shinji Nakano, Minami-echizen-cho (JP); Kouichi Ikeda, Echizen (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 67 days.

(21) Appl. No.: 15/027,414

(22) PCT Filed: Oct. 16, 2014

(86) PCT No.: PCT/JP2014/005246
§ 371 (c)(1),
(2) Date: Apr. 5, 2016

(87) PCT Pub. No.: WO2015/075864
PCT Pub. Date: May 28, 2015

(65) Prior Publication Data
US 2016/0237589 A1    Aug. 18, 2016

(30) Foreign Application Priority Data
Nov. 22, 2013   (JP) .................. 2013-242034

(51) Int. Cl.
*C30B 15/20* (2006.01)
*C30B 15/04* (2006.01)
(Continued)

(52) U.S. Cl.
CPC ............ *C30B 15/203* (2013.01); *C30B 15/04* (2013.01); *C30B 15/14* (2013.01); *C30B 15/206* (2013.01); *C30B 29/06* (2013.01); *C30B 30/04* (2013.01)

(58) Field of Classification Search
CPC ......... C30B 15/00; C30B 15/02; C30B 15/04; C30B 15/20
See application file for complete search history.

(56) References Cited

U.S. PATENT DOCUMENTS 6,284,041 B1 *   9/2001   Hamada ................. C30B 29/06
                                                              117/13
2011/0140241 A1*  6/2011  Kawazoe ................ C30B 15/04
                                                              257/607

FOREIGN PATENT DOCUMENTS

JP        2000-063198 A       2/2000
JP        2004-175620 A       6/2004
(Continued)

OTHER PUBLICATIONS

Jan. 6, 2015 Search Report issued in International Patent Application PCT/JP2014/005246.

*Primary Examiner* — Robert M Kunemund
(74) *Attorney, Agent, or Firm* — Oliff PLC

(57) ABSTRACT

A method for manufacturing a silicon single crystal according to a Czochralski method to manufacture an N-type silicon single crystal, including the steps of: seeding to bring a seed crystal into contact with a silicon melt in a crucible and thereafter, necking to pull the seed crystal to narrow a diameter thereof, wherein a dopant concentration in the silicon melt is predicted by a difference between a temperature at the seeding and a temperature at the necking, and resistivity of the single crystal to be pulled is controlled on the basis of the predicted dopant concentration in the silicon melt. A method for manufacturing a silicon single crystal can efficiently manufacture a silicon single crystal with a desired resistivity.

20 Claims, 2 Drawing Sheets

(51) Int. Cl.
  *C30B 29/06* (2006.01)
  *C30B 30/04* (2006.01)
  *C30B 15/14* (2006.01)

(56) References Cited

FOREIGN PATENT DOCUMENTS

JP  2005-314143 A  11/2005
JP  2012-206874 A  10/2012

* cited by examiner (a)           (b)

METHOD FOR MANUFACTURING SILICON SINGLE CRYSTAL

TECHNICAL FIELD

The present invention relates to a method for manufacturing an N-type silicon single crystal.

BACKGROUND ART

In recent years, demand for power MOS semiconductors has been increasing. It thus has become increasingly important to develop N-type silicon single crystals that have low resistivity as substrates for use in these semiconductors.

As a method for manufacturing such an N-type silicon single crystal with low resistivity, a method to pull a single crystal from a silicon melt being doped with an N-type dopant according to a Czochralski method is widely used. In this method, the single crystal is pulled with the N-type dopant added to the silicon melt so as to attain an aimed resistivity. N-type dopants, however, apt to evaporate from the silicon melt, and it is very difficult to control the resistivity of the obtained single crystal to a desired resistivity, especially in pulling a heavy-doped single crystal.

In pulling a heavy-doped N-type single crystal, a dislocation is apt to occur. When a dislocation occurs, a single crystal having the dislocation is re-melted to the silicon melt and re-pulling is conducted as described in paragraph [0015] in Patent Document 1, for example. In this case, the dopant is additionally doped in order to adjust the dopant concentration prior to the re-pulling, since N-type dopants such as phosphorous are apt to form oxides to evaporate from the silicon melt as described above.

The evaporation amount of the dopant during pulling the single crystal can be predicted in a certain degree. In a step to re-melt the single crystal having the dislocation, however, the silicon melt needs to be heated at high temperature and the evaporation amount of the dopant increases due to the high temperature. Therefore, the accuracy of the prediction is decreased.

Accordingly, when the re-melting and the re-pulling is repeated, the dopant concentration in the silicon melt comes to be unknown, and tend to deviate from the aimed concentration considerably. The large deviation from the aimed dopant concentration means that the resistivity of the obtained single crystal considerably deviates from the desired resistivity, which causes a problem that the manufactured single crystal cannot be a product.

CITATION LIST

Patent Literature

Patent Document 1: Japanese Unexamined Patent publication (Kokai) No. 2004-175620

SUMMARY OF INVENTION

Problem to be Solved by the Invention

The present invention was accomplished in view of the above-described problems. It is an object of the present invention to provide a method for manufacturing a silicon single crystal which can efficiently manufacture a silicon single crystal with a desired resistivity.

Means for Solving Problem

To solve the problems, the present invention provides a method for manufacturing a silicon single crystal according to a Czochralski method to manufacture an N-type silicon single crystal, comprising the steps of: seeding to bring a seed crystal into contact with a silicon melt in a crucible and thereafter, necking to pull the seed crystal to narrow a diameter thereof, wherein a dopant concentration in the silicon melt is predicted by a difference between a temperature at the seeding and a temperature at the necking, and resistivity of the single crystal to be pulled is controlled on the basis of the predicted dopant concentration in the silicon melt.

Such a method for manufacturing a silicon single crystal enables to predict the dopant concentration in the silicon melt accurately regardless of an operation time and so on, and therefore enables to efficiently manufacture a silicon single crystal having a desired resistivity by reflecting the predicted concentration to a manufacturing condition.

In this case, the dopant concentration in the silicon melt can be predicted by a pre-examined correlation of resistivity of a produced single crystal with the difference between a temperature at the seeding and a temperature at the necking.

The resistivity of the single crystal can be accurately controlled when the correlation is previously determined.

In this case, the temperature at the seeding and the temperature at the necking can be determined by a temperature of a graphite shield installed around a heater to heat the silicon melt.

It is difficult to measure the temperature of the silicon melt directly with high accuracy since the silicon melt is affected by reflection of HZ (hot zone) parts or chamber located above the silicon melt. Therefore, it is convenient to determine the temperature indirectly as described above, not only measuring the temperature of the silicon melt directly; and it is possible to determine the difference between a temperature at the seeding and a temperature at the necking with high accuracy by the temperature of the graphite shield.

In this case, the single crystal to be pulled is preferably a phosphorus (P) or arsenic (As)-doped silicon single crystal having resistivity of 2 mΩ·cm or less.

The phosphorus (P) or arsenic (As)-doped silicon single crystal with low resistivity is suitable for an N-type silicon single crystal with low resistivity used for a substrate of a power MOS semiconductor.

In this case, a difference between an aimed dopant concentration in the silicon melt and the predicted dopant concentration in the silicon melt can be adjusted on the basis of an evaporation amount of the dopant in manufacturing the single crystal.

Particularly, the evaporation amount of the dopant can be adjusted by changing a furnace pressure at a start of growing a straight body.

The evaporation amount of the dopant can be easily controlled by changing the furnace pressure as described above, and resistivity of the single crystal to be pulled can be controlled by adjusting the dopant concentration in the silicon melt.

When a silicon single crystal having a dislocation occurred during being pulled is melted to the silicon melt and the other silicon single crystal is re-pulled therefrom, it is preferable that the silicon melt after melting the silicon single crystal having a dislocation is additionally doped with a dopant in an amount reflecting the difference between an aimed dopant concentration and the predicted dopant concentration in the silicon melt, and the other silicon single crystal is re-pulled.

Such method enables to bring the dopant concentration in the silicon melt close to the aimed concentration more accurately when a silicon single crystal is re-pulled, and thereby a silicon single crystal with a desired resistivity can be efficiently manufactured.

It is also possible to pull the single crystal while a horizontal magnetic field with a central magnetic field strength of 0.15 T or more is applied.

Effect of Invention

As described above, in the inventive method for manufacturing a silicon single crystal, a dopant concentration in the silicon melt is predicted by a difference between a temperature at the seeding and a temperature at the necking, and the predicted dopant concentration is reflected to the manufacturing condition; and thereby it is possible to effectively manufacture an N-type silicon single crystal with a desired resistivity, particularly a one with low resistivity suitably used for a substrate of a power MOS semiconductor. When the re-pulling is conducted, it is also possible to bring the dopant concentration in the silicon melt close to an aimed concentration, and to efficiently manufacture a silicon single crystal with a desired resistivity thereby.

Furthermore, in the inventive method for manufacturing a silicon single crystal, the number of re-melting and re-pulling is finally reduced compared to the conventional method, and thereby the productivity can be improved.

DESCRIPTION OF EMBODIMENTS

As described above, in manufacturing an N-type silicon single crystal, there has been a problem that the dopant concentration in the silicon melt comes to be unknown due to evaporation of a dopant, and thereby the dopant concentration deviates considerably from the aimed concentration to fail to efficiently manufacture a single crystal with a desired resistivity.

It is known that the freezing temperature of a silicon melt is depressed as the dopant concentration gets higher. Although the temperature of a silicon melt can be measured by a radiation thermometer and so on, it is difficult to measure the absolute value with high accuracy, and accordingly it is not a practical method to estimate the dopant concentration directly from the temperature of the melt.

Accordingly, the present inventors have focused on a proper temperature at the seeding (T1) and a proper temperature at the necking (T2) in pulling the single crystal, and intensively investigated them to find that (T1–T2) is changed according to the dopant concentration in the silicon melt, and consequently the dopant concentration in the silicon melt can be estimated by (T1–T2), thereby brought the present invention to completion.

The present invention is a method for manufacturing a silicon single crystal according to a Czochralski method to manufacture an N-type silicon single crystal, comprising the steps of: seeding to bring a seed crystal into contact with a silicon melt in a crucible and thereafter, necking to pull the seed crystal to narrow a diameter thereof, wherein a dopant concentration in the silicon melt is predicted by a difference between a temperature at the seeding and a temperature at the necking, and resistivity of the single crystal to be pulled is controlled on the basis of the predicted dopant concentration in the silicon melt.

The present invention will be explained specifically with referring the figures in the following, but the present invention is not limited thereto.

Figure 1:
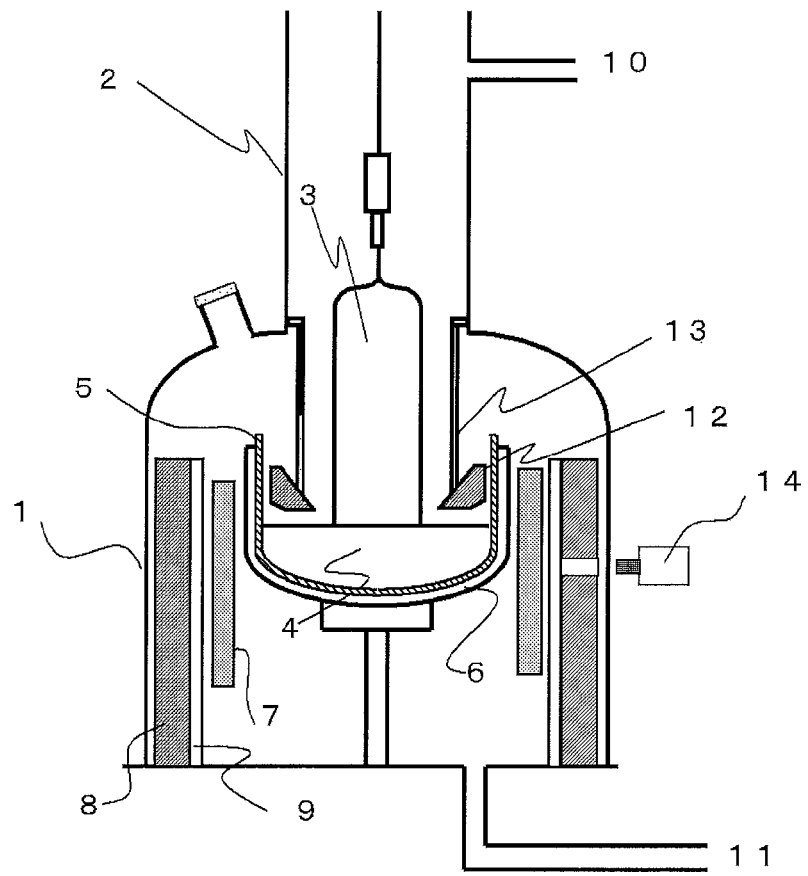
FIG. 1 is a schematic drawing to show an example of a single crystal manufacturing apparatus used for the inventive method for manufacturing a silicon single crystal.

FIG. 1 is a schematic drawing to show an example of a single crystal pulling apparatus used for an inventive method for manufacturing a silicon single crystal. The single crystal pulling apparatus of FIG. 1 will be explained in the following.

The quartz crucible 5 in the graphite crucible 6 set in the main chamber 1 is filled with the silicon melt 4, and the silicon single crystal 3 is pulled from this silicon melt 4 toward the inward of the chamber 2. The heater 7 for heating the silicon melt 4 is installed around the graphite crucible 6, and around this heater 7, the graphite shield 9 and the heat insulating part 8 are installed in order to insulate the heat from the heater 7. Inert gas such as argon is introduced via the gas inlet 10 to fill the single crystal pulling apparatus, and the gas is made to flow along the gas rectifying tube 13 and is exhausted via the gas outlet 11. On the silicon melt 4 side of the gas rectifying tube 13, the heat shield part 12 is installed to cut off the radiation from the heater 7 and the silicon melt 4.

On the outside of the single crystal pulling apparatus, the radiation thermometer 14 is installed, and a part of the heat insulating part 8 is removed at this position so as to be able to measure the temperature of the graphite shield 9.

A method for manufacturing a single crystal using the single crystal pulling apparatus of FIG. 1 will be explained in the following.

First, polycrystalline silicon is introduced in the quartz crucible 5 and heated with the heater 7 to melt the raw material. When the melting is complete, a dopant is added so as to obtain a desired resistivity.

As the N-type dopant, phosphorus (P) or arsenic (As) is preferable, and antimony (Sb) may be used in some cases. It is preferable to add the dopant in such an amount that the obtained silicon single crystal has resistivity of 2 mΩ·cm or less. Such phosphorus (P) or arsenic (As)-doped silicon single crystal with low resistivity is suitable for an N-type silicon single crystal with low resistivity used for a substrate of a power MOS semiconductor.

Then, the seeding step is conducted, in which manufacturing of a single crystal is started using a seed crystal having a desired crystal orientation. FIG. 2(a) is an explanation drawing of a seeding step.

In the seeding step, the seed crystal 22 set to the seed holder 21 is brought into contact with the silicon melt 4 which temperature is adjusted to the predicted appropriate temperature. As the temperature at the seeding, the final appropriate temperature (T1) is determined by observing a compatibility state between the seed crystal 22 and the silicon melt 4 after immersing the seed crystal 22. In this step, if the temperature is too low, solidification occurs around the seed crystal 22; on the other hand, if the temperature is too high, the seed crystal 22 begins to melt. Accordingly, it is possible to determine T1 by adjusting power to be supplied to the heater 7.

The temperature at the seeding and a temperature at the necking described later can be determined by a temperature of the graphite shield 9 installed around the heater 7, and the temperature of the graphite shield 9 can be measured by using the radiation thermometer 14 from outside of the single crystal pulling apparatus as described above.

It can be considered that the temperature of the graphite shield 9 is reflecting the output of the heater 7, that is, reflecting the temperature of the silicon melt 4. Accordingly, the temperature at the seeding and the temperature at the necking described later may be adjusted by adjusting the power supplied to the heater 7 on the basis of the measured temperature of the graphite shield 9.

Figure 2:
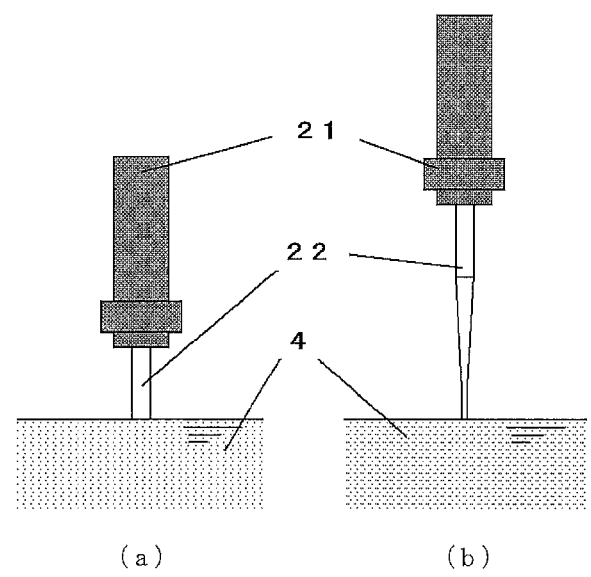
FIG. 2 is an explanation drawing of the seeding step (a) and the necking step (b)

Then, the necking process is conducted after the seeding process is finished. FIG. 2(*b*) is an explanation drawing of a necking step. In the necking process, a single crystal without a slip dislocation is formed by pulling the seed crystal while reducing its diameter to get rid of the slip dislocation introduced into the seed crystal 22 due to the thermal shock when the seed crystal 22 was immersed to the silicon melt 4 via the surface.

In the necking process, the pulling rate is adjusted so that the preset diameter is obtained. In the necking, however, an excessively late pulling rate is time-consuming, and an excessively fast pulling rate is said to be difficult to get rid of a slip dislocation, and accordingly, there is an aimed pulling rate as well as an aimed diameter. Consequently, there exists the appropriate temperature (T2) exclusively to satisfy both the aimed pulling rate and the aimed diameter in necking, and the temperature is controlled to that temperature.

After the necking step is finished, the following steps are conducted: a cone step to expand the diameter of the single crystal to an aimed diameter of a final product; a straight-body step to grow a part to form an actual product (straight-body) while controlling to the aimed diameter; and a tail step to reduce the diameter gradually, contrary to the cone step, to reduce the diameter as possible when the single crystal is cut off from the silicon melt so as not to occur a slip dislocation in the single crystal due to a thermal shock.

In the present invention, the dopant concentration in the silicon melt is predicted by the difference (T1-T2) between a temperature at the seeding (T1) and a temperature at the necking (T2) described above, and resistivity of the single crystal to be pulled is controlled on the basis of the predicted dopant concentration in the silicon melt in a method for manufacturing a silicon single crystal according to the foregoing steps.

This dopant concentration in the silicon melt can be predicted by the pre-examined correlation of the resistivity of a produced single crystal with the difference (T1-T2) between a temperature at the seeding (T1) and a temperature at the necking (T2).

Figure 3:
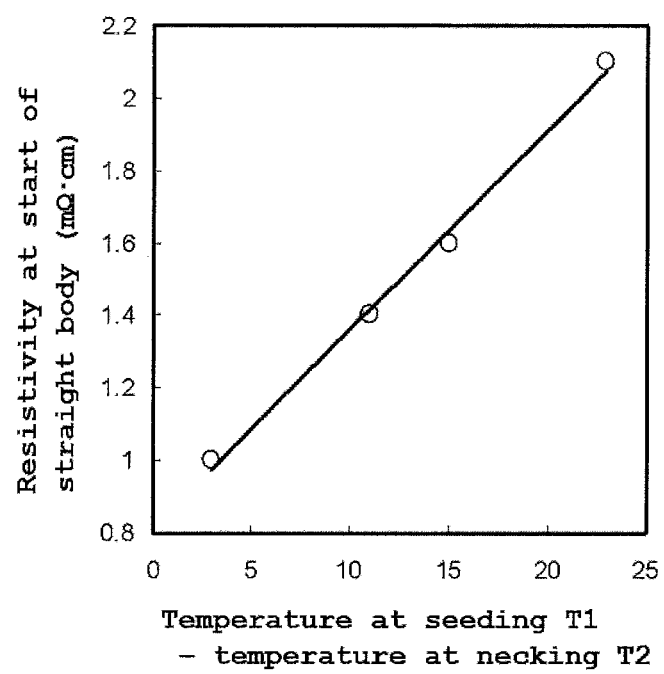
FIG. 3 is a graph to show a correlation of resistivity at a start of a straight body with (a temperature at the seeding T1–a temperature at the necking T2).

That is, the correlation of the measured resistivity of the single crystal with (T1-T2) as shown in the graph of FIG. 3 is previously examined, and then a temperature at the seeding (T1) and a temperature at the necking (T2) are measured in the actual manufacturing, and thus the dopant concentration in the silicon melt can be predicted by the pre-examined correlation.

When there is a difference between an aimed dopant concentration in the silicon melt and the dopant concentration in the silicon melt predicted as described above, the difference can be adjusted on the basis of an evaporation amount of the dopant in manufacturing the single crystal, for example.

The evaporation amount of the dopant can be adjusted by changing a furnace pressure at a start of growing the straight body. That is, when the dopant concentration is too high, the evaporation of the dopant can be promoted by reducing the furnace pressure; and when the dopant concentration is too low, the evaporation of the dopant can be suppressed by increasing the furnace pressure.

By such adjustment to bring the actual dopant concentration in the silicon melt close to an aimed dopant concentration in the silicon melt, a silicon single crystal with a desired resistivity can be efficiently manufactured.

When a dislocation has occurred in the single crystal, the single crystal having a dislocation is re-melted to the silicon melt and then re-pulling is conducted. In this case, since N-type dopants such as phosphorous are apt to form volatile oxides to evaporate from the silicon melt, the dopant is additionally doped before the re-pulling in order to adjust the dopant concentration.

In this case, the evaporation amount of the dopant increases with the passage of time. Accordingly, previously, the dopant have been additionally doped before the re-pulling in an amount calculated by an estimation as a simple function of time (dopant amount according to the loss time).

In the present invention, the dopant is additionally doped in an amount reflecting the difference between an aimed dopant concentration and the dopant concentration in the silicon melt predicted as described above, in addition to the foregoing amount of dopant according to the loss time. By doping such amount of the dopant additionally to the silicon melt after re-melting the silicon single crystal and then re-pulling another silicon single crystal, it is possible to bring the dopant concentration in the silicon melt close to the aimed concentration in the re-pulling, and to efficiently manufacture a silicon single crystal with a desired resistivity thereby.

The dopant can be additionally doped by any of the methods; for example, charging the dopant into a large spoon-form container, and inclining them to drop the dopant from the upper part of the chamber to the melt.

The foregoing pulling of the single crystal can be conducted while a horizontal magnetic field with a central magnetic field strength of 0.15 T or more is applied. Although the upper limit of the central magnetic field strength is not particularly limited, 1 T or less, for example, is preferable.

In addition, it is considered that the change of (T1-T2) according to the dopant concentration in the silicon melt, though its principle is not clear, is ascribed to the depression of freezing point and the changes of physical properties represented by thermal conductivity due to the change of the dopant concentration.

As described above, in the inventive method for manufacturing a silicon single crystal, the difference between a temperature at the seeding and a temperature at the necking is determined by a temperature of the graphite shield in an apparatus to predict the dopant concentration in the silicon melt, and the predicted dopant concentration is reflected to the manufacturing condition; and thereby it is possible to effectively manufacture an N-type silicon single crystal with a desired resistivity, particularly a one with low resistivity suitably used for a substrate of a power MOS semiconductor. When re-pulling is conducted, the dopant concentration in the silicon melt can be close to an aimed concentration, and thereby a silicon single crystal with a desired resistivity can be efficiently manufactured.

For single crystallization, less impurity is advantageous, and a dislocation is apt to occur when the dopant concentration gets higher. It is considered that if the evaporation amount cannot be grasped accurately, the dislocation occurs in higher rate when the concentration gets higher than the aimed value, and re-melting and re-pulling have to be repeated. When such phenomenon is occurred, the average number of times of the re-melting and re-pulling get higher.

On the other hand, in the present invention, the dislocation is hard to occur since the dopant concentration can be close to an aimed concentration, and as a result, the number of times of the re-melting and the re-pulling can be reduced, and the productivity can be improved.

EXAMPLE

The present invention will be more specifically described below with reference to Example and Comparative Example, but the present invention is not limited thereto.

EXAMPLE (1) Several batches of manufacture of a phosphorous-doped silicon single crystal with a diameter of 200 mm, resistivity of 1.1 to 1.3 mΩ·cm were conducted by charging 170 kg of silicon polycrystalline raw material to a crucible with an aperture of 26 inches (660 mm). In each batch, the initial dope amount of red phosphorous was 770 g. The phosphorous-doped silicon single crystal was pulled while a horizontal magnetic field with a central magnetic field strength of 0.4 T was applied.
(2) The temperature at the seeding (T1) was adjusted roughly with referring a radiation thermometer at first, and finally determined by a compatibility state between the seed crystal and the silicon melt. In the middle of the necking step, the temperature was corrected so as to make the temperature at the necking (T2) appropriate with referring a situation of a preceding pulling rate, and then, the final T2 was determined.
(3) The furnace pressure during the manufacture of a straight body was set to the condition which was 200 mbar at the top side and got lower with transition to the bottom side, at which 90 mbar. The reason why the furnace pressure was gradually reduced was to suppress excess decrease of resistivity due to segregation of the dopant at the bottom side.
(4) When (T1−T2) had deviated from a standard value, the furnace pressure was uniformly corrected simultaneously with a start of the straight body on the basis of a prepared table. The correction amount was set to in a range of −50 to 100 mbar and the correction time was set to 10 hours, and then the furnace pressure was set as in the foregoing recipe.
(5) When a dislocation in the single crystal had occurred, the silicon single crystal having a dislocation was melted and another silicon single crystal was re-pulled therefrom. Prior to the re-pulling, the dopant was doped in an amount in which a correction amount determined by (T1−T2) at the preceding pulling was added to the dopant amount according to the loss time. The correction amounts were 0 to 30 g.

The average number of re-melting and re-pulling in Example was 3.2 times per a batch.

It is needless to say that the correcting method in not limited to this Example, and better result can be expected by controlling the furnace pressure change and the time more minutely.

COMPARATIVE EXAMPLE

Several batches of manufacture of a phosphorous-doped silicon single crystal with a diameter of 200 mm were conducted by using the same single crystal pulling apparatus as Example and conducting the foregoing (1), (2), and (3) similarly. In Comparative Example, however, the correction of the furnace pressure of (4) was not conducted. Moreover, when a dislocation in the single crystal had occurred, although the silicon single crystal having a dislocation was melted and another silicon single crystal was re-pulled therefrom, the additional dopant amount before the re-pulling was determined only by the loss time, and the correction amount determined by (T1−T2) as in (5) was not considered.

The average number of re-melting and re-pulling in Comparative Example was 5.4 times per a batch.

Each fraction non-defective of Example and Comparative Example on the basis of the lengths of the finally obtained products relative to the initial set length of the product is shown in Table 1.

TABLE 1

|  | Example | Comparative Example |
|---|---|---|
| Fraction non-defective (%) | 84 | 72 |

As shown in Table 1, in Example, in which the furnace pressure was adjusted and the dopant concentration predicted by the (T1-T2) value was reflected to the additional dopant amount when the re-pulling was conducted, the fraction non-defective is improved compared to Comparative Example, in which such prediction and correction of the manufacture condition based on the prediction were not conducted.

Moreover, in Example, the number of re-melting and re-pulling was decreased compared to Comparative Example.

As described above, it has revealed that the inventive method for manufacturing a silicon single crystal can efficiently manufacture a silicon single crystal with a desired resistivity, and can improve the productivity since the number of re-melting and re-pulling is decreased.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A method for manufacturing a silicon single crystal according to a Czochralski method to manufacture an N-type silicon single crystal, comprising the steps of: seeding to bring a seed crystal into contact with a silicon melt in a crucible and thereafter, necking to pull the seed crystal to narrow a diameter thereof, wherein
   a dopant concentration in the silicon melt is predicted by a difference between a temperature at the seeding and a temperature at the necking, and resistivity of the single crystal to be pulled is controlled on the basis of the predicted dopant concentration in the silicon melt.

2. The method for manufacturing a silicon single crystal according to claim 1, wherein the dopant concentration in the silicon melt is predicted by a pre-examined correlation of resistivity of a produced single crystal with the difference between a temperature at the seeding and a temperature at the necking.

3. The method for manufacturing a silicon single crystal according to claim 1, wherein the temperature at the seeding and the temperature at the necking are determined by a temperature of a graphite shield installed around a heater to heat the silicon melt.

4. The method for manufacturing a silicon single crystal according to claim 2, wherein the temperature at the seeding and the temperature at the necking are determined by a temperature of a graphite shield installed around a heater to heat the silicon melt.

5. The method for manufacturing a silicon single crystal according to claim 1, wherein the single crystal to be pulled is a phosphorus or arsenic-doped silicon single crystal having resistivity of 2 mΩ·cm or less.

6. The method for manufacturing a silicon single crystal according to claim 2, wherein the single crystal to be pulled is a phosphorus or arsenic-doped silicon single crystal having resistivity of 2 mΩ·cm or less.

7. The method for manufacturing a silicon single crystal according to claim 3, wherein the single crystal to be pulled is a phosphorus or arsenic-doped silicon single crystal having resistivity of 2 mΩ·cm or less.

8. The method for manufacturing a silicon single crystal according to claim 4, wherein the single crystal to be pulled is a phosphorus or arsenic-doped silicon single crystal having resistivity of 2 mΩ·cm or less.

9. The method for manufacturing a silicon single crystal according to claim 1, wherein a difference between an aimed dopant concentration in the silicon melt and the predicted dopant concentration in the silicon melt is adjusted on the basis of an evaporation amount of the dopant in manufacturing the single crystal.

10. The method for manufacturing a silicon single crystal according to claim 2, wherein a difference between an aimed dopant concentration in the silicon melt and the predicted dopant concentration in the silicon melt is adjusted on the basis of an evaporation amount of the dopant in manufacturing the single crystal.

11. The method for manufacturing a silicon single crystal according to claim 3, wherein a difference between an aimed dopant concentration in the silicon melt and the predicted dopant concentration in the silicon melt is adjusted on the basis of an evaporation amount of the dopant in manufacturing the single crystal.

12. The method for manufacturing a silicon single crystal according to claim 4, wherein a difference between an aimed dopant concentration in the silicon melt and the predicted dopant concentration in the silicon melt is adjusted on the basis of an evaporation amount of the dopant in manufacturing the single crystal.

13. The method for manufacturing a silicon single crystal according to claim 9, wherein the evaporation amount of the dopant is adjusted by changing a furnace pressure at a start of growing a straight body.

14. The method for manufacturing a silicon single crystal according to claim 10, wherein the evaporation amount of the dopant is adjusted by changing a furnace pressure at a start of growing a straight body.

15. The method for manufacturing a silicon single crystal according to claim 11, wherein the evaporation amount of the dopant is adjusted by changing a furnace pressure at a start of growing a straight body.

16. The method for manufacturing a silicon single crystal according to claim 12, wherein the evaporation amount of the dopant is adjusted by changing a furnace pressure at a start of growing a straight body.

17. The method for manufacturing a silicon single crystal according to claim 1, wherein a silicon single crystal having a dislocation occurred during being pulled is melted to the silicon melt and the other silicon single crystal is re-pulled therefrom, wherein
the silicon melt after melting the silicon single crystal having a dislocation is additionally doped with a dopant in an amount reflecting the difference between an aimed dopant concentration and the predicted dopant concentration in the silicon melt, and then the other silicon single crystal is re-pulled.

18. The method for manufacturing a silicon single crystal according to claim 2, wherein a silicon single crystal having a dislocation occurred during being pulled is melted to the silicon melt and the other silicon single crystal is re-pulled therefrom, wherein
the silicon melt after melting the silicon single crystal having a dislocation is additionally doped with a dopant in an amount reflecting the difference between an aimed dopant concentration and the predicted dopant concentration in the silicon melt, and then the other silicon single crystal is re-pulled.

19. The method for manufacturing a silicon single crystal according to claim 1, wherein the single crystal is pulled while a horizontal magnetic field with a central magnetic field strength of 0.15 T or more is applied.

20. The method for manufacturing a silicon single crystal according to claim 2, wherein the single crystal is pulled while a horizontal magnetic field with a central magnetic field strength of 0.15 T or more is applied.

* * * * *